United States Patent
Lee et al.

(10) Patent No.: US 8,902,072 B2
(45) Date of Patent: Dec. 2, 2014

(54) APPARATUS AND METHOD FOR DIAGNOSING ABNORMALITY IN CELL BALANCING CIRCUIT

(75) Inventors: Sang-Hoon Lee, Daejeon (KR); Dal-Hoon Lee, Daejeon (KR); Ju-Hyun Kang, Daejeon (KR); Jee-Ho Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 460 days.

(21) Appl. No.: 13/195,578

(22) Filed: Aug. 1, 2011

(65) Prior Publication Data

US 2011/0285538 A1 Nov. 24, 2011

Related U.S. Application Data

(63) Continuation of application No. PCT/KR2010/005583, filed on Aug. 23, 2010.

(30) Foreign Application Priority Data

Mar. 5, 2010 (KR) .................. 10-2010-0019924

(51) Int. Cl.
*G08B 21/00* (2006.01)
*G01R 31/28* (2006.01)
*H02J 7/00* (2006.01)
*G01R 31/36* (2006.01)

(52) U.S. Cl.
CPC ............... *G01R 31/28* (2013.01); *H02J 7/0016* (2013.01); *Y02T 10/7055* (2013.01); *G01R 31/3658* (2013.01)
USPC ................... 340/636.1; 340/636.17; 340/635; 340/636.2; 340/649; 340/660; 340/664; 324/425; 324/433; 324/434; 324/450; 324/500; 320/118; 320/116; 320/152; 320/127; 320/134; 701/34.4; 429/61; 702/63

(58) Field of Classification Search
USPC ......... 340/635, 636.17, 636.2, 649, 660–664, 340/636.1; 324/425, 433–434, 450, 500, 324/522; 320/118, 116, 152, 127, 134; 701/34.4; 429/61; 702/63
See application file for complete search history.

(56) References Cited

U.S. PATENT DOCUMENTS

2004/0155629 A1 8/2004 Kobayashi et al.
2008/0143298 A1 6/2008 Yoshida (Continued)

FOREIGN PATENT DOCUMENTS

CN 101396975 A 4/2009
EP 1 603 212 A2 12/2005

(Continued)

OTHER PUBLICATIONS

Cao, J. et al., "Battery Balancing Methods: A Comprehensive Review," Vehicle Power and Propulsion Conference, Sep. 3, 2008, pp. 1-6.

*Primary Examiner* — Benjamin C Lee
*Assistant Examiner* — Chico A Foxx
(74) *Attorney, Agent, or Firm* — Birch, Stewart, Kolasch & Birch, LLP

(57) ABSTRACT

Provided are an apparatus and a method for diagnosing an abnormality in a cell balancing circuit. The apparatus may include a plurality of cell balancing circuits respectively connected to a plurality of battery cells included in a battery pack for balancing the voltages of the battery cells, a diagnosis resistor respectively installed between the cell balancing circuit and a cathode terminal and an anode terminal of the corresponding battery cell, a voltage measuring unit for measuring a voltage difference of the balancing circuit corresponding to each of the battery cells, and a control unit for turning on or off a cell balancing circuit to be diagnosed and for determining whether there is an abnormality in the cell balancing circuit to be diagnosed, based on a variation pattern of a voltage difference of a cell balancing circuit adjacent to the cell balancing circuit to be diagnosed that is measured by the voltage measuring unit.

27 Claims, 6 Drawing Sheets

OPEN-CIRCUIT

(56) References Cited

U.S. PATENT DOCUMENTS

| | | |
|---|---|---|
| 2009/0085516 A1 | 4/2009 | Emori et al. |
| 2009/0087722 A1* | 4/2009 | Sakabe et al. .................. 429/61 |
| 2009/0208821 A1* | 8/2009 | Kosugi et al. .................. 429/61 |
| 2009/0302802 A1* | 12/2009 | Miyazaki et al. ............. 320/116 |
| 2009/0309545 A1* | 12/2009 | Kunimitsu .................... 320/118 |
| 2010/0063757 A1 | 3/2010 | Suzuki ............................ 702/63 |
| 2010/0225496 A1* | 9/2010 | Hou et al. ................... 340/636.1 |
| 2010/0244847 A1* | 9/2010 | Kudo et al. .................. 324/433 |

FOREIGN PATENT DOCUMENTS

| | | |
|---|---|---|
| EP | 1 603 212 A3 | 1/2007 |
| JP | 2002-354684 A | 12/2002 |
| JP | 2004-266992 A | 9/2004 |
| JP | 2006-294339 A | 10/2006 |
| JP | 2007-085847 A | 4/2007 |
| JP | 2008-175804 A | 7/2008 |
| JP | 2009-89488 A | 4/2009 |
| JP | 2009-159769 A | 7/2009 |
| WO | WO 2009/014407 A2 | 1/2009 |

* cited by examiner

NORMAL

SHORT-CIRCUIT

OPEN-CIRCUIT

APPARATUS AND METHOD FOR DIAGNOSING ABNORMALITY IN CELL BALANCING CIRCUIT

CROSS-REFERENCE TO RELATED APPLICATION

This application is a continuation of International Application No. PCT/KR2010/005583 filed on Aug. 23, 2010, which claims priority to Korean Patent Application No. 10-2010-0019924 filed in Republic of Korea on Mar. 5, 2010, the entire contents of which are incorporated herein by reference.

TECHNICAL FIELD

The present invention relates to an apparatus and a method for diagnosing an abnormality in a cell balancing circuit, and more particularly, to an apparatus and a method for diagnosing an abnormality in a cell balancing circuit by determining whether there is an abnormality in a cell balancing switch included in the cell balancing circuit.

BACKGROUND ART

Recently, with exhaustion of fossil fuels and concern about environmental pollution, there is an increasing interest in electric vehicles or hybrid vehicles using electrical energy, but not using fossil energy.

To run the electric vehicles or hybrid vehicles, a driving motor requiring a high output should be operated. For this purpose, batteries for the electric vehicles or hybrid vehicles use, as a power source, electricity outputted from a battery pack including a plurality of battery cells connected in series.

A plurality of battery cells included in the battery pack need to individually maintain a uniform voltage for ensuring stability, a long life span, and a high output.

A method for uniformly balancing the charging voltages of battery cells includes increasing the voltage of a battery cell having a relatively low voltage by supplying a charging current, decreasing the voltage of a battery cell having a relatively high voltage by discharging the corresponding battery cell, discharging a battery cell having a voltage higher than a target balance voltage set based on the voltage of each battery cell and charging a battery cell having a voltage lower than the target balance voltage, and the like.

These cell balancing methods are implemented by a cell balancing circuit connected to each battery cell. The cell balancing circuit includes a switching circuit for controlling the start and end of a cell balancing operation, and a discharging resistor for discharging a battery cell.

However, when an abnormality occurs during a cell balancing operation using the cell balancing circuit, for example, when overcurrent instantaneously flows in the cell balancing circuit, or when overvoltage higher than an operating voltage is applied to a switching circuit, or when overheat is generated through a discharging resistor, a component included in the cell balancing circuit is short-circuited or open-circuited, and consequently, the cell balancing circuit is not operated normally.

When the cell balancing circuit abnormally operates due to this problem, the voltage of a battery cell connected to the corresponding cell balancing circuit excessively increases or decreases, and as a result, severe results may be produced, for example, a battery pack may explode or the operation of a load connected to the battery pack may suddenly stop.

To overcome this drawback, there is a need of a separate diagnosis circuit connected to a cell balancing circuit for diagnosing an abnormality in the cell balancing circuit.

For example, Japanese Patent Publication No. 2007-085847 (conventional art) discloses an apparatus for detecting an abnormality in a cell balancing circuit, in which the cell balancing circuit including a field effect transistor (FET) and a discharging resistor, and a resistor interposed between the source and the drain of the FET are installed at each battery cell, a difference in voltage between the source and the drain is measured through the resistor using two comparators applied with different levels of reference power sources, and an abnormality of the cell balancing circuit is determined based on the measured voltage level (high, low).

However, the conventional art needs a separate circuit configuration, that is, the diagnosis circuit for detecting an abnormality in the cell balancing circuit, and the additional two comparators for each diagnosis circuit, and thus, it has a disadvantage of increased manufacturing cost of the apparatus. Also, it is possible to determine whether there is an abnormality in a cell balancing circuit corresponding to each cell, but it is difficult to correctly recognize the cause of an abnormality when the abnormality occurs in the entire cell balancing circuit.

DISCLOSURE

Technical Problem

The present invention is designed to solve the problems of the conventional art, and therefore, it is an object of the invention to provide an apparatus and a method for diagnosing an abnormality in a cell balancing circuit, which may determine whether there is an abnormality in a cell balancing circuit and if any, the cause of the abnormality correctly using a simple circuit configuration.

Technical Solution

In order to achieve the object, an apparatus for diagnosing an abnormality in a cell balancing circuit according to an aspect of the present invention may include a plurality of cell balancing circuits respectively connected to a plurality of battery cells included in a battery pack for balancing voltages of the battery cells, a diagnosis resistor respectively installed between the cell balancing circuit and a cathode terminal and an anode terminal of the corresponding battery cell, a voltage measuring unit for measuring a voltage difference of the balancing circuit corresponding to each of the battery cells, and a control unit for turning on or off a cell balancing circuit to be diagnosed and for determining whether there is an abnormality in the cell balancing circuit to be diagnosed, based on a variation pattern of the voltage difference of a cell balancing circuit adjacent to the cell balancing circuit to be diagnosed that is measured by the voltage measuring unit.

Preferably, the voltage difference of the adjacent cell balancing circuit may be a difference in voltage between a low potential node where one end of the adjacent cell balancing circuit is connected to an anode terminal of the corresponding battery cell and a high potential node where the other end of the adjacent cell balancing circuit is connected to a cathode terminal of the corresponding battery cell.

Preferably, the cell balancing circuit may include a discharge resistor for discharging the corresponding battery cell, and a cell balancing switch for establishing a connection between the discharge resistor and the corresponding battery cell or for releasing the connection, and the control unit may control the turn-on or turn-off of the cell balancing switch to balance the voltages of the battery cells.

According to the present invention, the cell balancing circuit may further include a diode for limiting the flow of a discharge current and a return current through the discharge resistor.

According to the present invention, the cell balancing switch may be a field effect transistor (FET).

Preferably, the control unit may turn off the adjacent cell balancing circuit and turn on or off the cell balancing circuit to be diagnosed, and the control unit may control measures the voltage difference of the adjacent cell balancing circuit through the voltage measuring unit when the cell balancing circuit to be diagnosed is turned on or off.

According to an aspect of the present invention, the control unit may determine that the cell balancing circuit to be diagnosed is normal, when the voltage difference of the adjacent cell balancing circuit measured while the cell balancing circuit to be diagnosed is turned on, has a higher voltage level than the corresponding cell voltage, and when the voltage difference of the adjacent cell balancing circuit measured while the cell balancing circuit to be diagnosed is turned off, has the same voltage level as the corresponding cell voltage.

According to another aspect of the present invention, the control unit may determine that an open circuit occurred in the cell balancing circuit to be diagnosed, when the voltage differences of the adjacent cell balancing circuit measured while the cell balancing circuit to be diagnosed is turned on and off, have the same voltage level as the corresponding cell voltage.

According to still another aspect of the present invention, the control unit may determine that a short circuit occurred in the cell balancing circuit to be diagnosed, when the voltage differences of the adjacent cell balancing circuit measured while the cell balancing circuit to be diagnosed is turned on and off, have a higher voltage level than the corresponding cell voltage.

In order to achieve the object, an apparatus for diagnosing an abnormality in a cell balancing circuit according to another aspect of the present invention may include a plurality of cell balancing circuits respectively connected to a plurality of battery cells included in a battery pack for balancing voltages of the battery cells, a voltage measuring unit for measuring a voltage difference of the cell balancing circuit corresponding to each of the battery cells, a discharge resistor and a diagnosis switch installed between a battery cell at a highest potential side or a lowest potential side and the corresponding cell balancing circuit, and a control unit for turning on or off the entire cell balancing circuit and turning on or off the diagnosis switch, and for determining whether there is an abnormality in the entire cell balancing circuit based on a variation pattern of the voltage difference of the entire cell balancing circuit measured by the voltage measuring unit when the diagnosis switch is turned on and off.

According to an aspect of the present invention, the control unit may determine that an open circuit occurred in the entire cell balancing circuit, when the voltage differences of the entire cell balancing circuit measured while the entire cell balancing circuit is turned on and the diagnosis switch is turned on and off, have the same voltage level as the entire cell voltage.

According to another aspect of the present invention, the control unit may determine that a short circuit occurred in the entire cell balancing circuit, when the voltage difference of the entire cell balancing circuit measured while the entire cell balancing circuit is turned off and the diagnosis switch is turned on, has a smaller voltage level than the voltage difference of the entire cell balancing circuit measured while the entire cell balancing circuit is turned off and the diagnosis switch is turned off.

According to the present invention, the control unit may include a switch control module for controlling the operation of the cell balancing switch included in the cell balancing circuit, an analog/digital (A/D) conversion module for converting an analog voltage signal outputted from the voltage measuring unit into a digital voltage signal, and a central processing module for receiving the digital voltage signal from the A/D conversion module and determining whether there is an abnormality in the cell balancing circuit.

Optionally, the apparatus may further include an abnormality alarm for visually or audibly outputting an abnormality in the cell balancing circuit, and the control unit may control the abnormality alarm to visually or audibly inform an abnormality in the cell balancing circuit when the abnormality occurs in the cell balancing circuit.

The object of the present invention may be achieved by a battery management system, a battery operating system, a battery pack comprising the above-described apparatus for diagnosing an abnormality in a cell balancing circuit.

In order to achieve the object, a method for diagnosing an abnormality in a cell balancing circuit according to an aspect of the present invention may diagnose an abnormality in a plurality of cell balancing circuits respectively connected to a plurality of battery cells included in a battery pack for balancing voltages of the battery cells, and the method may include measuring a voltage difference of a cell balancing circuit adjacent to a cell balancing circuit to be diagnosed when the cell balancing circuit to be diagnosed is turned on and the adjacent cell balancing circuit is turned off, measuring a voltage difference of the adjacent cell balancing circuit when the cell balancing circuit to be diagnosed is turned off and the adjacent cell balancing circuit is turned off, and determining whether there is an abnormality in the cell balancing circuit to be diagnosed, based on a variation pattern of the voltage difference of the adjacent cell balancing circuit measured when the cell balancing circuit to be diagnosed is turned on or off.

In order to achieve the object, a method for diagnosing an abnormality in the entire cell balancing circuit according to another aspect of the present invention may diagnose an abnormality in the entire cell balancing circuit using a plurality of cell balancing circuits respectively connected to a plurality of battery cells included in a battery pack for balancing voltages of the battery cells, and a discharge resistor and a diagnosis switch installed between a battery cell at a highest potential side or a lowest potential side and the corresponding cell balancing circuit, and the method may include measuring a voltage difference of the entire cell balancing circuit when the entire cell balancing circuit is turned on or off and the diagnosis switch is turned on or off, and determining whether there is an abnormality in the entire cell balancing circuit, based on a variation pattern of the voltage difference of the entire cell balancing circuit measured when the diagnosis switch is turned on or off.

Effect of the Invention

According to the present invention, an abnormality in a cell balancing circuit and the cause of the abnormality may be diagnosed using a simple circuit configuration. Also, even when the entire cell balancing circuit is short-circuited or open-circuited, the cause of the abnormality may be correctly diagnosed. Accordingly, damage to a battery or a load caused by the abnormality in the cell balancing circuit may be prevented.

DESCRIPTION OF DRAWINGS

These and other features, aspects, and advantages of preferred embodiments of the present invention will be more fully described in the following detailed description, taken accompanying drawings.

MODE FOR INVENTION

Hereinafter, the present invention will be described in detail with reference to the accompanying drawings. Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
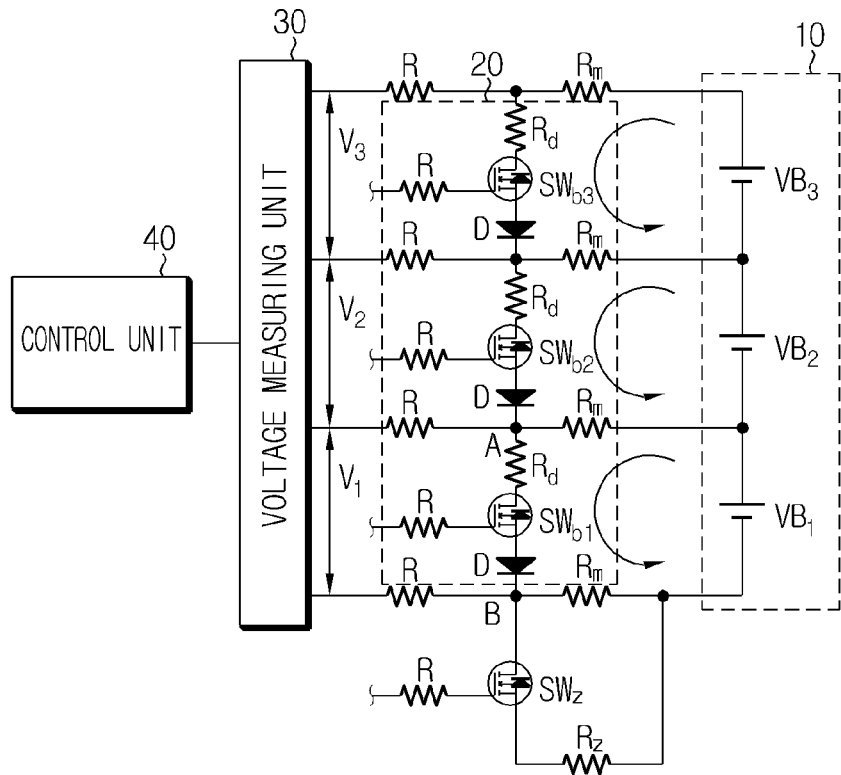
FIG. 1 is a circuit diagram of an apparatus for diagnosing an abnormality in a cell balancing circuit according to a preferred embodiment of the present invention.

FIG. 1 is a circuit diagram of an apparatus for diagnosing an abnormality in a cell balancing circuit according to a preferred embodiment of the present invention. Although FIG. 1 shows three cells, the present invention is not limited to a specific number of cells.

Referring to FIG. 1, the apparatus for diagnosing an abnormality in a cell balancing circuit according to the present invention may include a plurality of cell balancing circuits 20 respectively connected to a plurality of battery cells $VB_1$, $VB_2$, and $VB_3$ included in a battery pack 10 for balancing the voltages of the battery cells $VB_1$, $VB_2$, and $VB_3$, a diagnosis resistor $R_m$ respectively installed between the cell balancing circuit 20 and cathode and anode terminals of each of the battery cells $VB_1$, $VB_2$, and $VB_3$, a voltage measuring unit 30 for measuring a voltage difference of the cell balancing circuit 20 respectively corresponding to the battery cells $VB_1$, $VB_2$, and $VB_3$, and a control unit 40 for determining whether there is an abnormality in the cell balancing circuit 20 to be diagnosed based on a variation pattern of the voltage difference of the cell balancing circuit 20 adjacent to the cell balancing circuit 20 to be diagnosed that is measured by the voltage measuring unit 30.

The cell balancing circuit 20 may be a protection circuit of the battery pack 10 for balancing the voltages of the battery cells $VB_1$, $VB_2$, and $VB_3$ under the control of the control unit 40.

The cell balancing circuit 20 may be, at each end, connected to voltage measuring lines connected to cathode and anode terminals of each of the battery cells $VB_1$, $VB_2$, and $VB_3$, and may be connected to the battery cells $VB_1$, $VB_2$, and $VB_3$ in parallel, respectively. In this instance, a node where one end of the corresponding cell balancing circuit 20 is connected to a voltage measuring line extending from a cathode terminal of each of the battery cells $VB_1$, $VB_2$, and $VB_3$ may be a high potential node A, and a node where the other end of the corresponding cell balancing circuit 20 is connected to a voltage measuring line extending from an anode terminal of each of the battery cells $VB_1$, $VB_2$, and $VB_3$ may be a low potential node B. Also, a voltage difference of the cell balancing circuit 20 is a difference in voltage between the high potential node A and the low potential node B. Here, the high potential node A and the low potential node B are relative points where the cell balancing circuit 20 and the voltage measuring line are connected, and for example, a connection point of the cell balancing circuit 20 and a voltage measuring line connected to and extending from a cathode terminal of the first cell $VB_1$ is a high voltage node A, and in turn, the high voltage node A may act as a low voltage node B at a connection point of the cell balancing circuit 20 and a voltage measuring line connected to and extending from an anode terminal of the second cell $VB_2$.

The cell balancing circuit 20 may include a discharge resistor $R_d$ for discharging each of the battery cells $VB_1$, $VB_2$, and $VB_3$, and cell balancing switches $SW_{b1}$, $SW_{b2}$, and $SW_{b3}$ for establishing a connection between the battery cells $VB_1$, $VB_2$, and $VB_3$ and the discharge resistor $R_d$ or releasing the connection, respectively. Also, although not essential, the cell balancing circuit 20 may further include a diode D at the side of the low potential node B of the cell balancing circuit 20 to limit the flow of a discharge current and a return current through the discharge resistor $R_d$. In this instance, the cell balancing switches $SW_{b1}$, $SW_{b2}$, and $SW_{b3}$ may be preferably a field effect transistor (FET). The FET has a source terminal, a drain terminal, and a gate terminal, and when an operating voltage is applied to the gate terminal under the control of the control unit 40, the cell balancing circuit 20 is turned on and the battery cells $VB_1$, $VB_2$, and $VB_3$ are discharged through the discharge resistor $R_d$.

In the present invention, the diagnosis resistor $R_m$ is a component used to diagnose an abnormality in the cell balancing switches $SW_{b1}$, $SW_{b2}$, and $SW_{b3}$, and while the battery cells $VB_1$, $VB_2$, and $VB_3$ are discharged, the cell balancing circuit 20 may make a difference in voltage between when a discharge current flows through the discharge resistor $R_d$ and when a discharge current does not flow. That is, when the cell balancing switches $SW_{b1}$, $SW_{b2}$, and $SW_{b3}$ are turned on or short-circuited, a discharge current may flow along a discharge loop indicated as an arrow. In this instance, when compared with the case where the discharge current does not flow, the potential of the high potential node may decrease due to the discharge current flowing through the diagnosis resistor $R_m$ at the side of the high potential node, and the potential of the low potential node may increase due to the discharge current flowing through the diagnosis resistor $R_m$ at the side of the low potential node. As a result, a voltage difference between the nodes of the cell balancing circuit 20 through which the discharge current flows may decrease when compared with the case where the discharge current does not flow. Conversely, when the cell balancing switches $SW_{b1}$, $SW_{b2}$, and $SW_{b3}$ are turned off or open-circuited, the discharge current does not flow along the discharge loop, and in this case, a voltage difference between the nodes of the cell balancing circuit 20 may have the same voltage level as the cell voltage. This is because a voltage drop across the diagnosis resistor $R_m$ does not occur and an original cell voltage is applied between the nodes when the discharge current does not flow along the discharge loop.

When the cell balancing switches $SW_{b1}$, $SW_{b2}$, and $SW_{b3}$ are turned on or off under the control of the cell balancing circuit 20, the voltage measuring unit 30 may measure a voltage difference between the high potential node A and the low potential node B of the cell balancing circuit 20 for the purpose of diagnosing an abnormality in the cell balancing switches $SW_{b1}$, $SW_{b2}$, and $SW_{b3}$, and may output the voltage difference as an analog voltage signal.

Preferably, the voltage measuring unit 30 may use a typical circuit to periodically measure the cell voltages of the battery cells $VB_1$, $VB_2$, and $VB_3$. In this instance, the voltage measuring unit 30 does not need a separate voltage measuring unit 30 to diagnose an abnormality in the cell balancing circuit 20.

Figure 2:
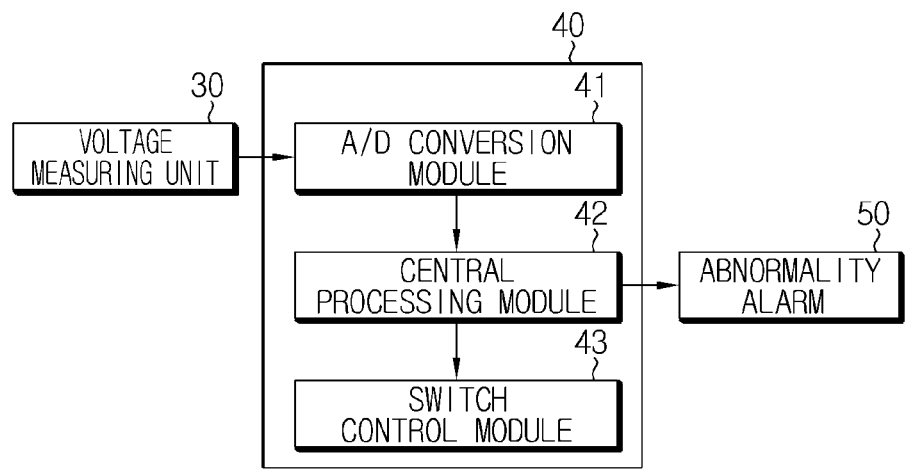
FIG. 2 is a block diagram illustrating a structure of a control unit according to a preferred embodiment of the present invention.

FIG. 2 is a block diagram illustrating a structure of the control unit 40 according to a preferred embodiment of the present invention.

As shown in FIG. 2, the control unit 40 may include an analog/digital (A/D) conversion module 41, a central processing module 42, and a switch control module 43.

The A/D conversion module 41 may convert the analog voltage signal outputted from the voltage measuring unit 30 into a digital voltage signal, and may output the digital voltage signal to the central processing module 42. The analog voltage signal may include a signal corresponding to the cell voltage of each of the battery cells $VB_1$, $VB_2$, and $VB_3$, and a voltage signal corresponding to the voltage difference of the cell balancing circuit 20.

The central processing module 42 may receive the digital voltage signal from the A/D conversion module 41, and may determine whether there is an abnormality in the cell balancing circuit 20 and if any, the cause of the abnormality. That is, the central processing module 42 may determine an abnormality in the cell balancing circuit 20 to be diagnosed and the cause of the abnormality based on a variation pattern of the voltage difference of the cell balancing circuit 20 adjacent to the cell balancing circuit 20 to be diagnosed.

The switch control module 43 may control the turn-on or turn-off of the cell balancing switches $SW_{b1}$, $SW_{b2}$, and $SW_{b3}$ included in the cell balancing circuit 20.

Hereinafter, a process for determining an abnormality in the cell balancing circuit 20 and the cause of the abnormality by the apparatus for diagnosing an abnormality in a cell balancing circuit according to a preferred embodiment of the present invention is described below with regard to an abnormality diagnosis process in the cell balancing circuit 20 corresponding to the second cell $VB_2$.

First, the control unit 40 may turn off the cell balancing switches $SW_{b1}$ and $SW_{b3}$ of the first cell $VB_1$ and the third cell $VB_3$ adjacent to the second cell $VB_2$ to be diagnosed, and may turn on the cell balancing switch $SW_{b2}$ of the second cell $VB_2$. Next, the control unit 40 may measure and store a voltage difference of each of the cell balancing circuits 20 corresponding to the first cell $VB_1$ and the third cell $VB_3$ through the voltage measuring unit 30. Next, the control unit 40 may turn off the cell balancing switch $SW_{b2}$ of the second cell $VB_2$, and may measure and store a voltage difference of each of the cell balancing circuits 20 corresponding to the first cell $VB_1$ and the third cell $VB_3$ through the voltage measuring unit 30. In this instance, the control unit 40 may sequentially turn on or turn off the cell balancing switch $SW_{b2}$ of the second cell $VB_2$.

Here, the term 'sequentially' means controlling the turn-on or turn-off of the cell balancing switch $SW_{b2}$ at a time interval, and it will be applied as the same concept throughout the specification. Next, the control unit 40 may analyze a variation pattern of the voltage difference of each of the cell balancing cells 20 corresponding to the first cell $VB_1$ and the third cell $VB_3$ measured when the cell balancing switch $SW_{b2}$ of the second cell $VB_2$ of the second cell $VB_2$ is turned on or off, and may determine whether there is an abnormality in the cell balancing circuit 20 corresponding to the second cell $VB_2$ and if any, the cause of the abnormality, based on the analysis results.

<Case 1: where a Cell Balancing Circuit of a Second Cell is Normal>

Figure 3:
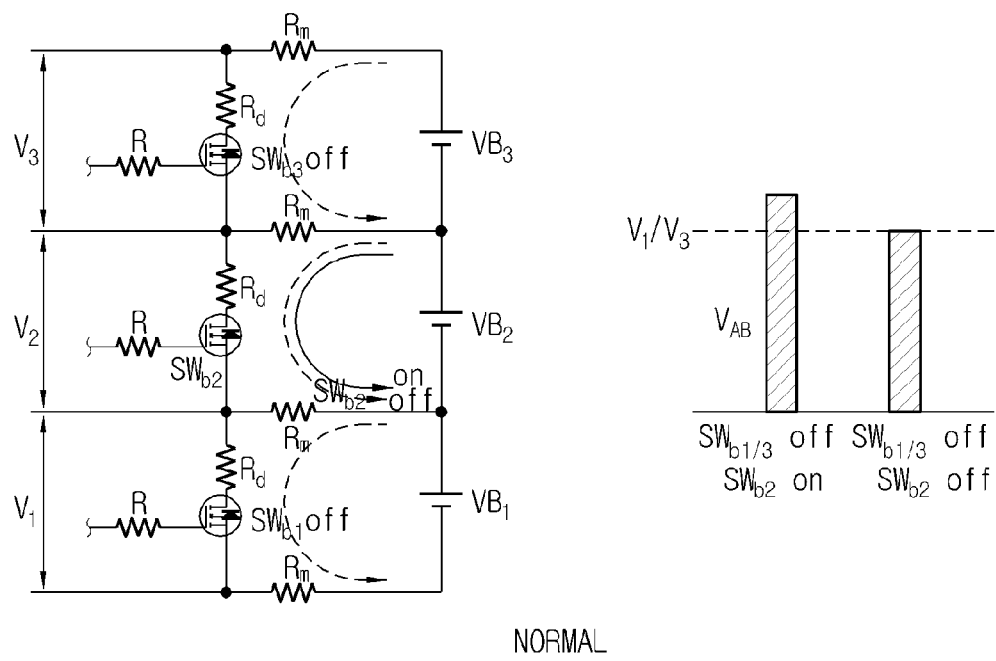
FIGS. 3 to 5 are diagrams illustrating a method for diagnosing an abnormality in a cell balancing circuit and the cause of the abnormality according to a preferred embodiment of the present invention.

As shown in FIG. 3, when the cell balancing switch $SW_{b2}$ of the second cell $VB_2$ is turned on, a voltage difference $V_{AB}$ of each of the cell balancing cells 20 corresponding to the first cell $VB_1$ and the third cell $VB_3$ adjacent to the second cell $VB_2$ has a higher voltage level than the cell voltages $V_1$ and $V_3$, respectively. When the cell balancing switch $SW_{b2}$ of the second cell $VB_2$ is turned on, a discharge current flows along a discharge loop of the second cell $VB_2$, and accordingly, the potential of the high potential node of the first cell $VB_1$ increases and the potential of the low potential node of the third cell $VB_3$ decreases, so that a voltage difference $V_{AB}$ of each of the cell balancing circuits 20 corresponding to the first cell $VB_1$ and the third cell $VB_3$ has a higher voltage level than the cell voltages $V_1$ and $V_3$, respectively. Also, when the cell balancing switch $SW_{b2}$ of the second cell $VB_2$ is turned off, a voltage difference $V_{AB}$ of each of the cell balancing circuits 20 corresponding to the first cell $VB_1$ and the third cell $VB_3$ has the same voltage level as the cell voltages $V_1$ and $V_3$, respectively.

Accordingly, when a voltage difference of an adjacent cell balancing circuit measured while a cell balancing circuit of a cell to be diagnosed is turned on, has a higher voltage level than a corresponding cell voltage, and when a voltage difference of an adjacent cell balancing circuit measured while a cell balancing circuit of a cell to be diagnosed is turned off, has the same voltage level as a corresponding cell voltage, the control unit determines that the cell balancing circuit of the cell to be diagnosed is normal.

<Case 2: where a Short Circuit Occurred in a Cell Balancing Circuit of a Second Cell>

Figure 4:
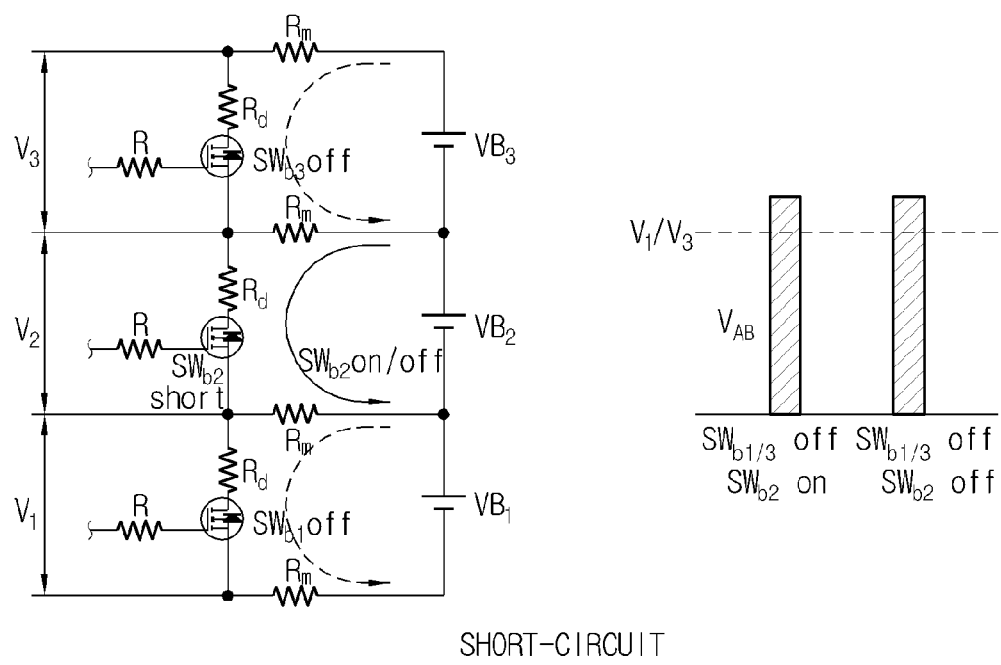

As shown in FIG. 4, when the cell balancing switch $SW_{b2}$ of the second cell $VB_2$ is short-circuited, a discharge current flows along a discharge loop regardless of whether the cell balancing switch $SW_{b2}$ is turned on or off. As a result, a voltage difference $V_{AB}$ of each of the cell balancing circuits 20 corresponding to the first cell $VB_1$ and the third cell $VB_3$ has a higher voltage level than the cell voltages $V_1$ and $V_3$, respectively, regardless of whether the cell balancing switch $SW_{b2}$ of the second cell $VB_2$ is turned on or off. The reason why a voltage difference of an adjacent cell balancing circuit has a higher voltage level than a corresponding cell voltage when a discharge current flows along a discharge loop of the second cell $VB_2$ is described above with regard to the case 1.

Accordingly, when voltage differences of an adjacent cell balancing circuit measured while a cell balancing circuit of a cell to be diagnosed is turned on and off, have a higher voltage level than a corresponding cell voltage, the control unit determines that a short circuit occurred in the cell balancing circuit of the cell to be diagnosed.

<Case 3: where an Open Circuit Occurred in a Cell Balancing Circuit of a Second Cell>

Figure 5:
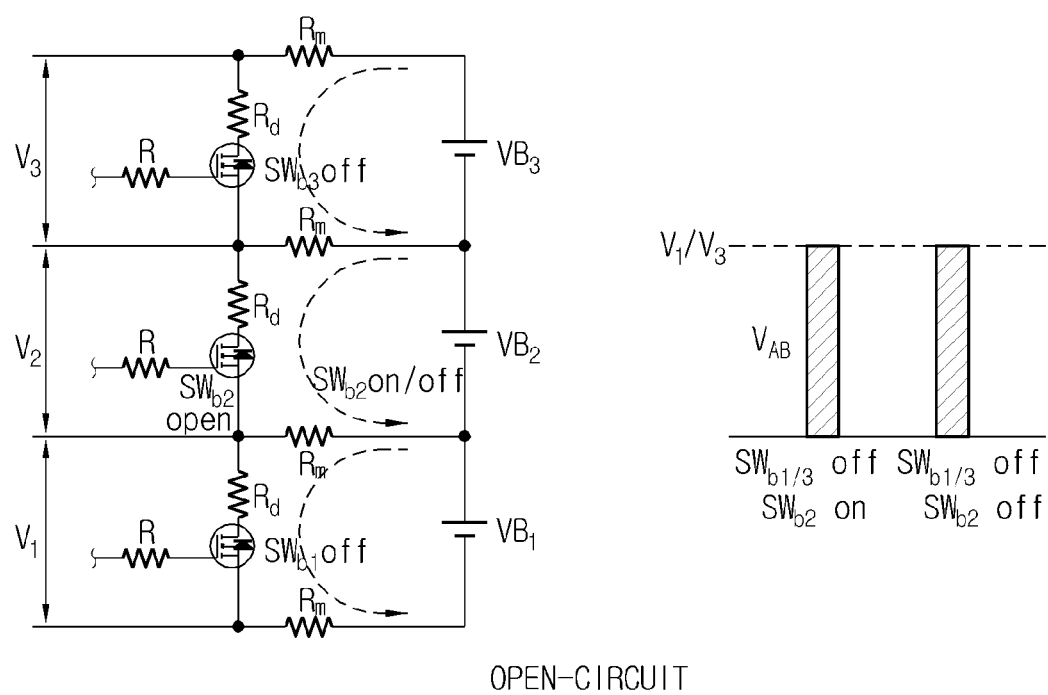

As shown in FIG. 5, when the cell balancing switch $SW_{b2}$ of the second cell $VB_2$ is open-circuited, a discharge current does not flow along a discharge loop regardless of whether the cell balancing switch $SW_{b2}$ is turned on or off. As a result, a voltage difference $V_{AB}$ of each of the cell balancing circuits 20 corresponding to the first cell $VB_1$ and the third cell $VB_3$ has the same voltage level as the cell voltages $V_1$ and $V_3$, respectively, regardless of whether the cell balancing switch $SW_{b2}$ of the second cell $VB_2$ is turned on or off.

Accordingly, when voltage differences of an adjacent cell balancing circuit measured while a cell balancing circuit of a cell to be diagnosed is turned on and off, have the same voltage level as a corresponding cell voltage, the control unit determines that an open circuit occurred in the cell balancing circuit of the cell to be diagnosed. Meanwhile, the open circuit in the cell balancing circuit may include an open circuit in the discharge resistor $R_d$ and an open circuit in a circuit line of the cell balancing circuit as well as an open circuit in a cell balancing switch. In this case, it is obvious that a variation pattern of a voltage difference of a cell balancing circuit adjacent to a cell balancing circuit to be diagnosed will show the same aspect as the variation pattern of the voltage difference shown in FIG. 5.

The apparatus for diagnosing an abnormality in a cell balancing circuit according to the present invention may further include an additional circuit configuration for correctly diagnosing a short circuit or an open circuit in the entire cell balancing circuit.

Specifically, as shown in FIG. 1, the apparatus for diagnosing an abnormality in a cell balancing circuit according to the present invention may further include a discharge resistor $R_z$ and a diagnosis switch $SW_z$ installed between the battery cell $VB_1$ at the lowest potential side and the cell balancing circuit 20 corresponding to the battery cell $VB_1$. It is obvious that the discharge resistor $R^z$ and the diagnosis switch $SW_z$ may be installed between the battery cell $VB_3$ at the highest potential side and the cell balancing circuit 20 corresponding to the battery cell $VB_3$.

A process for determining an abnormality in the entire cell balancing circuit and the cause of the abnormality in the apparatus for diagnosing an abnormality in a cell balancing circuit according to the present invention is described below.

First, the control unit 40 may turn on all of the cell balancing switches $SW_{b1}$, $SW_{b2}$, and $SW_{b3}$, and the control unit 40 may measure a voltage difference of the cell balancing circuit 20 corresponding to each of the battery cells $VB_1$, $VB_2$, and $VB_3$ through the voltage measuring unit 30, and sum up the measured voltage differences to calculate a first voltage difference of the entire cell balancing circuit 20. Next, the control unit 40 may turn on the diagnosis switch $SW_z$ while all of the cell balancing switches $SW_{b1}$, $SW_{b2}$, and $SW_{b3}$ are turned on, and the control unit 40 may measure a voltage difference of the cell balancing circuit 20 corresponding to each of the battery cells $VB_1$, $VB_2$, and $VB_3$ through the voltage measuring unit 30, and sum up the measured voltage differences to calculate a second voltage difference of the entire cell balancing circuit 20. Next, the control unit 40 may compare the first voltage difference of the entire cell balancing circuit 20 with the second voltage difference of the entire cell balancing circuit 20, and when the first voltage difference has the same voltage level as the second voltage difference, the control unit 40 may determine that an open circuit occurred in the entire cell balancing circuit 20.

Conversely, the control unit 40 may turn off all of the cell balancing switches $SW_{b1}$, $SW_{b2}$, and $SW_{b3}$, and the control unit 40 may measure a voltage difference of the cell balancing circuit 20 corresponding to each of the battery cells $VB_1$, $VB_2$, and $VB_3$ through the voltage measuring unit 30, and sum up the measured voltage differences to calculate a first voltage difference of the entire cell balancing circuit 20. Next, the control unit 40 may turn on the diagnosis switch $SW_z$ while all of the cell balancing switches $SW_{b1}$, $SW_{b2}$, and $SW_{b3}$ are turned off, and the control unit 40 may measure a voltage difference of the cell balancing circuit 20 corresponding to each of the battery cells $VB_1$, $VB_2$, and $VB_3$ through the voltage measuring unit 30, and sum up the measured voltage differences to calculate a second voltage difference of the entire cell balancing circuit 20. Next, the control unit 40 may compare the first voltage difference of the entire cell balancing circuit 20 with the second voltage difference of the entire cell balancing circuit 20, and when the second voltage difference has a smaller voltage level than the first voltage difference, the control unit 40 may determine that a short circuit occurred in the entire cell balancing circuit 20.

As described above, the reason why the first voltage difference of the entire cell balancing circuit has the same voltage level as the second voltage difference of the entire cell balancing circuit when an open circuit occurred in the entire cell balancing circuit, is because a discharge current does not flow into the discharge resistor $R_z$ side. Also, the reason why the second voltage difference of the entire cell balancing circuit has a smaller voltage level than the first voltage difference of the entire cell balancing circuit when a short circuit occurred in the entire cell balancing circuit, is because a discharge current flows into the discharge resistor $R_z$ side and a voltage drop effect by the discharge resistor $R_z$ is reflected on the voltage difference of the entire cell balancing circuit.

As shown in FIG. 2, the apparatus for diagnosing an abnormality in a cell balancing circuit according to the present invention may further include an abnormality alarm 50. In this case, when an abnormality occurs in the cell balancing circuit 20, the control unit 40 may control the abnormality alarm 50 to inform the abnormality. That is, when the control unit 40 determines there is an abnormality in the cell balancing circuit 20, the control unit 40 may control the abnormality alarm 50 to visually or audibly inform the abnormality by transmitting an abnormality alarm signal to the abnormality alarm 50.

The abnormality alarm 50 may include a liquid emitting display (LED), a liquid crystal display (LCD), an alarm, or combinations thereof. In this instance, when the abnormality alarm signal is inputted, the abnormality alarm 50 may flash an LED, may output an alarm message on an LCD, or may generate an alarm buzz, to inform the abnormality in the cell balancing circuit to a user. The exemplary LED, LCD, and alarm are just an example of the abnormality alarm 50, and it is obvious to an ordinary person skilled in the art that various types of modified visual or audio alarms may be used in the abnormality alarm 50.

It is also obvious to an ordinary person skilled in the art that diagnosis of an abnormality in a cell balancing circuit as described above may be repeatedly performed at a predetermined interval, and may be performed in response to a user's diagnosis command or a diagnosis command automatically generated by a control algorithm of the control unit 40.

Also, the control unit 40 may be configured as a microprocessor to execute a program code for implementing a method for diagnosing an abnormality in a cell balancing circuit, or as an application-specific integrated circuit (ASIC) with a logic circuit for implementing a control stream of a method for diagnosing an abnormality in a cell balancing circuit, however the present invention is not limited in this regard.

The above-described apparatus for diagnosing an abnormality in a cell balancing circuit according to the present invention may be used in association with a battery operating system that is provided with a power source from a battery pack.

As an example, the present invention may be used in association with a various kinds of electronic appliances provided with an operating voltage from batteries, such as notebook computers, mobile phones, personal portable multimedia players, and the like.

As another example, the present invention may be used in association with a various kinds of power equipment such as fossil fuel vehicles, electric vehicles, hybrid vehicles, electric bicycles, and the like.

Also, the present invention may be included in a battery management system (BMS) for controlling charge/discharge of a battery pack and protecting a battery pack from overcharge, over-discharge, and the like.

Further, the apparatus for diagnosing an abnormality in a cell balancing circuit according to the present invention may be included in a battery pack.

Figure 6:
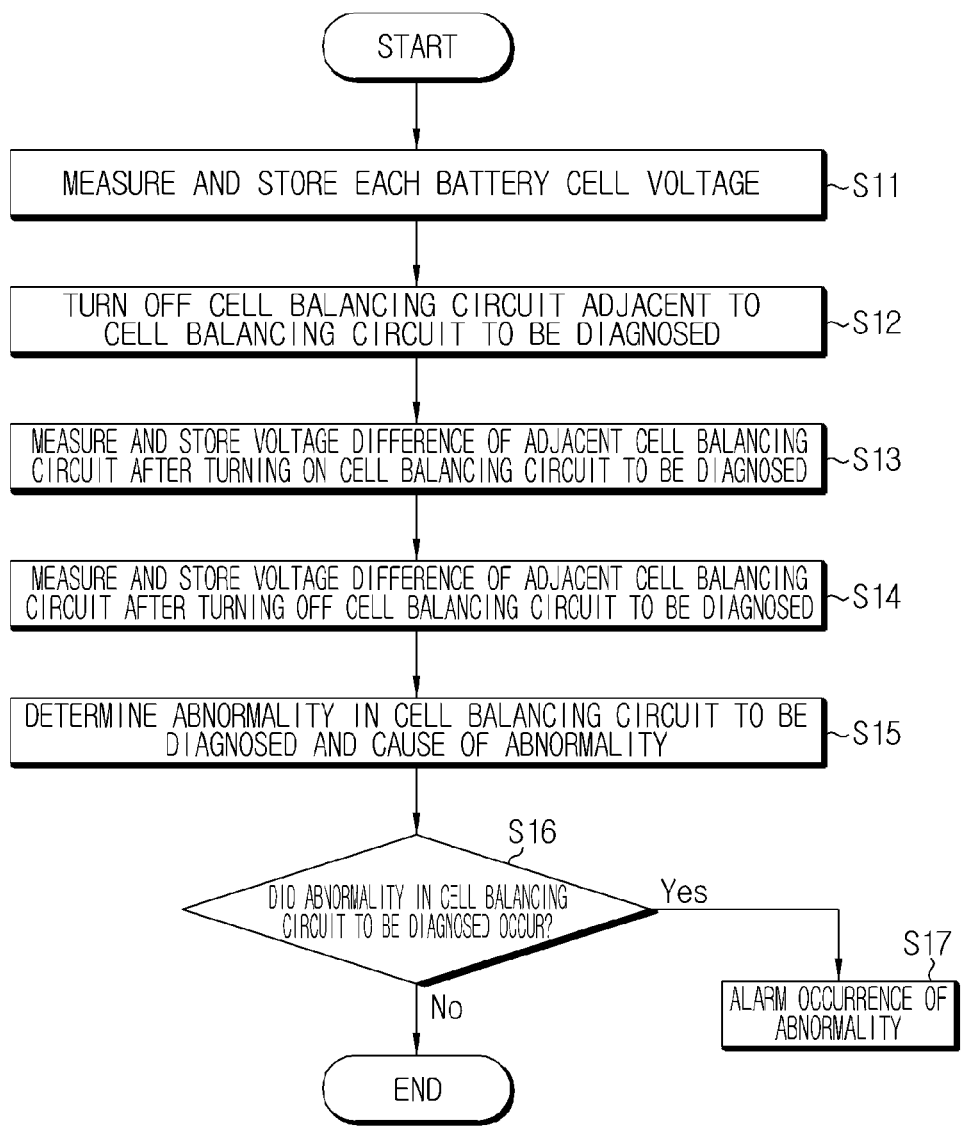
FIG. 6 is a flowchart illustrating a method for diagnosing an abnormality in a cell balancing circuit according to a preferred embodiment of the present invention.

FIG. 6 is a flowchart illustrating a method for diagnosing an abnormality in a cell balancing circuit according to a preferred embodiment of the present invention. Hereinafter, the turn-on or turn-off of the cell balancing circuit 20 means turn-on or turn-off of the cell balancing switches $SW_{b1}$, $SW_{b2}$, and $SW_{b3}$ included in the cell balancing circuit 20.

First, in step S11, the control unit may measure and store the cell voltage of each battery cell through the voltage measuring unit. In this instance, the control unit may turn off a cell balancing circuit corresponding to each battery cell.

In step S12, the control unit may turn off a cell balancing circuit adjacent to a cell balancing circuit to be diagnosed.

In step S13, the control unit may turn on the cell balancing circuit to be diagnosed while the adjacent cell balancing circuit is turned off, and may measure and store a voltage difference of the adjacent cell balancing circuit.

In step S14, the control unit may turn off the cell balancing circuit to be diagnosed while the adjacent cell balancing circuit is turned off, and the control unit may measure and store a voltage difference of the adjacent cell balancing circuit.

In step S15, the control unit may determine whether there is an abnormality in the cell balancing circuit to be diagnosed and if any, the cause of the abnormality, based on a variation pattern of the voltage difference of the adjacent cell balancing circuit measured when the adjacent cell balancing circuit is turned on or off.

That is, when the voltage difference of the adjacent cell balancing circuit measured while the cell balancing circuit to be diagnosed is turned on, has a higher voltage level than the corresponding cell voltage, and when the voltage difference of the adjacent cell balancing circuit measured while the cell balancing circuit to be diagnosed is turned off, has the same voltage level as the corresponding cell voltage, the control unit may determine that the cell balancing circuit to be diagnosed is normal.

Also, when the voltage differences of the adjacent cell balancing circuit measured while the cell balancing circuit to be diagnosed is turned on and off, have the same voltage level as the corresponding cell voltage, the control unit determines that an open circuit occurred in the cell balancing circuit to be diagnosed.

Also, when the voltage differences of the adjacent cell balancing circuit measured while the cell balancing circuit to be diagnosed is turned on and off, have a higher voltage level than the corresponding cell voltage, the control unit determines that a short circuit occurred in the cell balancing circuit to be diagnosed.

In step S16, the control unit may proceed with an alternate process based on the abnormality diagnosis result of the cell balancing circuit. When it is determined there is no abnormality in the cell balancing circuit to be diagnosed, the control unit may terminate the process for diagnosing an abnormality in a cell balancing circuit. Conversely, when it is determined there is an abnormality in the cell balancing circuit to be diagnosed, the control unit may perform the step S17 for visually or audibly informing the abnormality to a user through the abnormality alarm.

It is obvious to an ordinary person skilled in the art that the steps S11 to S17 may be performed for each cell balancing circuit corresponding to each battery cell. Also, it is obvious to an ordinary person skilled in the art that diagnosis of an abnormality in the cell balancing circuit may be repeatedly performed at a predetermined interval, and may be performed in response to a user's diagnosis command or a diagnosis command automatically generated by a control algorithm of the control unit.

Figure 7:
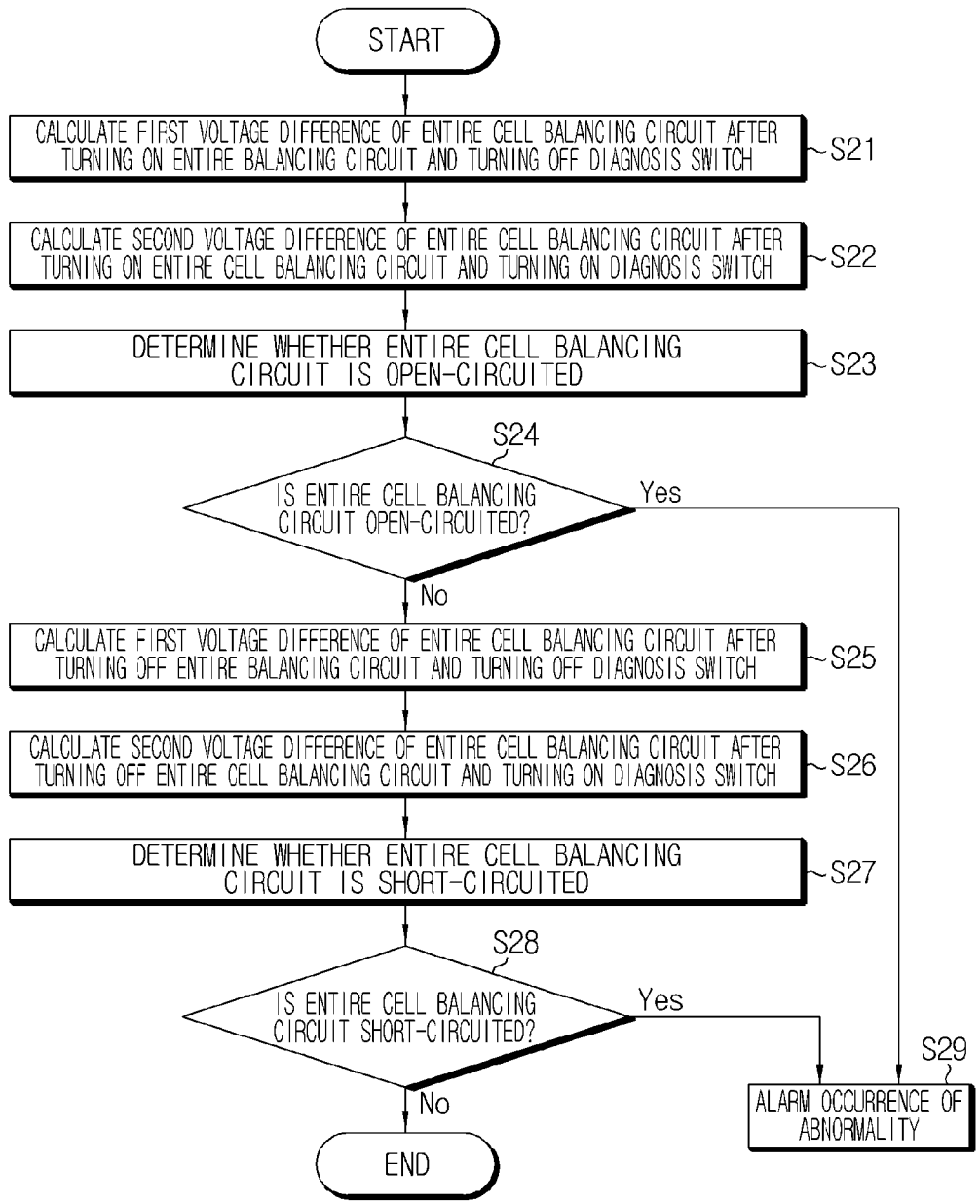
FIG. 7 is a flowchart illustrating a method for diagnosing an abnormality in the entire cell balancing circuit according to a preferred embodiment of the present invention.

FIG. 7 is a flowchart illustrating a method for diagnosing an abnormality in the entire cell balancing circuit according to a preferred embodiment of the present invention.

First, in step S21, the control unit may turn on the entire cell balancing circuit and turn off the diagnosis switch, and may measure a voltage difference of each cell balancing circuit through the voltage measuring unit, and sum up the measured voltage differences to calculate a first voltage difference of the entire cell balancing circuit.

In step S22, the control unit may turn on the diagnosis switch while the entire cell balancing circuit is turned on, and may measure a voltage difference of each cell balancing circuit through the voltage measuring unit, and sum up the measured voltage differences to calculate a second voltage difference of the entire cell balancing circuit.

In step S23, the control unit may compare the first voltage difference of the entire cell balancing circuit with the second voltage difference of the entire cell balancing circuit. When the first voltage difference has the same voltage level as the second voltage difference, the control unit may determine that an open circuit occurred in the entire cell balancing circuit.

In step S24, the control unit may proceed with an alternate process based on the abnormality diagnosis result of the entire cell balancing circuit. When it is determined that an open circuit occurred in the entire cell balancing circuit, the control unit may perform the step S29 for visually or audibly informing the open circuit in the entire cell balancing circuit to a user through the abnormality alarm. When it is determined that the open circuit did not occur in the entire cell balancing circuit, the control unit may perform the step S25.

In step S25, the control unit may turn off the diagnosis switch and turn off the entire cell balancing circuit, and may measure a voltage difference of each cell balancing circuit through the voltage measuring unit, and sum up the measured voltage differences to calculate a first voltage difference of the entire cell balancing circuit.

In step S26, the control unit may turn on the diagnosis switch while the entire cell balancing circuit is turned off, and may measure a voltage difference of each cell balancing circuit through the voltage measuring unit, and sum up the measured voltage differences to calculate a second voltage difference of the entire cell balancing circuit.

In step S27, the control unit may compare the first voltage difference of the entire cell balancing circuit with the second voltage difference of the entire cell balancing circuit. When the second voltage difference of the entire cell balancing circuit has a smaller voltage level than the first voltage difference of the entire cell balancing circuit, the control unit may determine that a short circuit occurred in the entire cell balancing circuit.

In step S28, the control unit may proceed with an alternate process based on the abnormality diagnosis result of the entire cell balancing circuit. When it is determined that a short circuit occurred in the entire cell balancing circuit, the control unit may perform the step S29 for visually or audibly informing the short circuit in the entire cell balancing circuit to a user through the abnormality alarm. When it is determined that the short circuit did not occur in the entire cell balancing circuit, the control unit may terminate the process for diagnosing an abnormality in the entire cell balancing circuit.

It is obvious to an ordinary person skilled in the art that the method for diagnosing an abnormality in a cell balancing circuit may be repeatedly performed at a predetermined interval during use of a battery pack, and may be performed in response to a user's diagnosis command or a diagnosis command automatically generated by a control algorithm of the control unit.

Also, the configuration for outputting the abnormality diagnosis result of the cell balancing circuit to the abnormality alarm may be omitted. In this case, the control unit may preferably store and maintain the abnormality diagnosis result and the cause of the abnormality in a memory.

The present invention is not limited to a specific order of turn-on or turn-off of the cell balancing circuit and the diagnosis switch. Various changes and modifications may be arbitrarily made to the order of turn-on or turn-off of the cell balancing circuit and the diagnosis switch without departing from the spirit and scope of the present invention.

Hereinafter, the preferred embodiments of the present invention are described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An apparatus for diagnosing an abnormality in a cell balancing circuit, the apparatus comprising:
a plurality of cell balancing circuits respectively connected to a plurality of battery cells included in a battery pack for balancing voltages of the battery cells;
a diagnosis resistor respectively installed between each cell balancing circuit and each of a cathode terminal and an anode terminal of the corresponding battery cell;
a voltage measuring unit for measuring a voltage difference of each balancing circuit corresponding to each of the battery cells; and
a control unit for turning on or off a cell balancing circuit to be diagnosed among said plurality of cell balancing circuits and for determining whether there is an abnormality in the cell balancing circuit to be diagnosed, based on a variation pattern of the voltage difference of a cell balancing circuit adjacent to the cell balancing circuit to be diagnosed that is measured by the voltage measuring unit between the on and off states,
wherein the voltage difference of each cell balancing circuit is a difference in voltage between a low potential node where one end of the cell balancing circuit is connected to an anode terminal of the corresponding battery cell across one diagnosis resistor, and a high potential node where the other end of the cell balancing circuit is connected to a cathode terminal of the corresponding battery cell across another diagnosis resistor.

2. The apparatus for diagnosing an abnormality in a cell balancing circuit according to claim 1, wherein the cell balancing circuit includes:
a discharge resistor for discharging the corresponding battery cell; and
a cell balancing switch for establishing a connection between the discharge resistor and the corresponding battery cell or for releasing the connection,
wherein the control unit controls the turn-on or turn-off of the cell balancing switch to balance the voltages of the battery cells.

3. The apparatus for diagnosing an abnormality in a cell balancing circuit according to claim 2, wherein the cell balancing circuit further includes a diode for limiting the flow of a discharge current and a return current through the discharge resistor.

4. The apparatus for diagnosing an abnormality in a cell balancing circuit according to claim 2, wherein the cell balancing switch is a field effect transistor (FET).

5. The apparatus for diagnosing an abnormality in a cell balancing circuit according to claim 1, wherein the control unit turns off the adjacent cell balancing circuit and turns on or off the cell balancing circuit to be diagnosed, and the control unit measures the voltage difference of the adjacent cell balancing circuit through the voltage measuring unit when the cell balancing circuit to be diagnosed is turned on or off.

6. The apparatus for diagnosing an abnormality in a cell balancing circuit according to claim 1, wherein the control unit determines that the cell balancing circuit to be diagnosed is normal, when the voltage difference of the adjacent cell balancing circuit measured while the cell balancing circuit to be diagnosed is turned on, has a higher voltage level than the corresponding cell voltage, and when the voltage difference of the adjacent cell balancing circuit measured while the cell balancing circuit to be diagnosed is turned off, has the same voltage level as the corresponding cell voltage.

7. The apparatus for diagnosing an abnormality in a cell balancing circuit according to claim 1, wherein the control unit determines that an open circuit occurred in the cell balancing circuit to be diagnosed, when the voltage differences of the adjacent cell balancing circuit measured while the cell balancing circuit to be diagnosed is turned on and off, have the same voltage level as the corresponding cell voltage.

8. The apparatus for diagnosing an abnormality in a cell balancing circuit according to claim 1, wherein the control unit determines that a short circuit occurred in the cell balancing circuit to be diagnosed, when the voltage differences of the adjacent cell balancing circuit measured while the cell balancing circuit to be diagnosed is turned on and off, have a higher voltage level than the corresponding cell voltage.

9. The apparatus for diagnosing an abnormality in a cell balancing circuit according to claim 1, wherein the control unit includes:
a switch control module for controlling the operation of the cell balancing switch included in the cell balancing circuit;
an analog/digital (A/D) conversion module for converting an analog voltage signal outputted from the voltage measuring unit into a digital voltage signal; and
a central processing module for receiving the digital voltage signal from the A/D conversion module and determining whether there is an abnormality in the cell balancing circuit.

10. The apparatus for diagnosing an abnormality in a cell balancing circuit according to claim 1, further comprising:
    an abnormality alarm for visually or audibly outputting an abnormality in the cell balancing circuit,
    wherein the control unit controls the abnormality alarm to visually or audibly inform an abnormality in the cell balancing circuit when the abnormality occurs in the cell balancing circuit.

11. A battery management system comprising the apparatus for diagnosing an abnormality in a cell balancing circuit defined in claims 1.

12. A battery operating system comprising the apparatus for diagnosing an abnormality in a cell balancing circuit defined in claim 1.

13. A battery pack comprising the apparatus for diagnosing an abnormality in a cell balancing circuit defined in claim 1.

14. An apparatus for diagnosing an abnormality in a cell balancing circuit, the apparatus comprising:
    a plurality of cell balancing circuits respectively connected to a plurality of battery cells included in a battery pack for balancing voltages of the battery cells;
    a diagnosis resistor respectively installed between each cell balancing circuit and each of a respective cathode terminal and a respective anode terminal of the corresponding battery cell;
    a voltage measuring unit for measuring a voltage difference of each cell balancing circuit corresponding to each of the battery cells;
    a discharge resistor and a diagnosis switch installed between one battery cell that is at a highest potential side or a lowest potential side of the battery cells and the corresponding cell balancing circuit; and
    a control unit for turning on or off the entire plurality of cell balancing circuits and turning on or off the diagnosis switch, and for determining whether there is an abnormality in the entire plurality of cell balancing circuits based on a variation pattern of a first voltage difference and a second voltage difference of the entire plurality of cell balancing circuits measured by the voltage measuring unit when the diagnosis switch is turned on and off, the abnormality includes an open circuit and a short circuit;
    wherein the voltage difference of each cell balancing circuit is a difference in voltage between a low potential node where one end of the cell balancing circuit is connected to an anode terminal of the corresponding battery cell across one diagnosis resistor, and a high potential node where the other end of the cell balancing circuit is connected to a cathode terminal of the corresponding battery cell across another diagnosis resistor;
    the first voltage difference is calculated from the sum of voltage differences of all the cell balancing circuits when they are all turned on or off while the diagnosis switch is turned off; and
    wherein the second voltage difference is calculated from the sum of voltage differences of all the cell balancing circuits when they are all turned on or off while the diagnosis switch is turned on.

15. The apparatus for diagnosing an abnormality in a cell balancing circuit according to claim 14, wherein
    the control unit determines that an open circuit occurred in the entire plurality of cell balancing circuits, when the sums of voltage differences of the entire plurality of cell balancing circuits measured while the entire plurality of cell balancing circuits are turned on and the diagnosis switch is turned on and off, respectively, each has the same voltage level as the entire cell voltage.

16. The apparatus for diagnosing an abnormality in a cell balancing circuit according to claim 14, wherein
    the control unit determines that a short circuit occurred in the entire plurality of cell balancing circuits, when the sum of voltage differences of the entire plurality of cell balancing circuits measured while the entire plurality of cell balancing circuits are turned off and the diagnosis switch is turned on, has a smaller voltage level than the sum of voltage differences of the entire plurality of cell balancing circuits measured while the entire plurality of cell balancing circuits are turned off and the diagnosis switch is turned off.

17. The apparatus for diagnosing an abnormality in a cell balancing circuit according to claim 14, wherein the control unit includes:
    a switch control module for controlling the operation of the cell balancing switch included in the cell balancing circuit;
    an analog/digital (A/D) conversion module for converting an analog voltage signal outputted from the voltage measuring unit into a digital voltage signal; and
    a central processing module for receiving the digital voltage signal from the A/D conversion module and determining whether there is an abnormality in the cell balancing circuit.

18. The apparatus for diagnosing an abnormality in a cell balancing circuit according to claim 14, further comprising:
    an abnormality alarm for visually or audibly informing an abnormality in the entire plurality of cell balancing circuits when the abnormality is determined by the control unit.

19. A method for diagnosing an abnormality in a cell balancing circuit, which diagnoses an abnormality in a plurality of cell balancing circuits respectively connected to a plurality of battery cells included in a battery pack for balancing voltages of the battery cells, with a diagnosis resistor respectively installed between each cell balancing circuit and each of a respective cathode terminal and a respective anode terminal of the corresponding battery cell, the method comprising:
    measuring a voltage difference of a cell balancing circuit adjacent to a cell balancing circuit to be diagnosed when the cell balancing circuit to be diagnosed is turned on and the adjacent cell balancing circuit is turned off;
    measuring a voltage difference of the adjacent cell balancing circuit when the cell balancing circuit to be diagnosed is turned off and the adjacent cell balancing circuit is turned off; and
    determining whether there is an abnormality in the cell balancing circuit to be diagnosed, based on a variation pattern of the voltage differences of the adjacent cell balancing circuit measured when the cell balancing circuit to be diagnosed is turned on and off,
    wherein voltage difference is a difference in voltage between a low potential node where one end of the respective cell balancing circuit is connected to an anode terminal of the corresponding battery cell across one diagnosis resistor, and a high potential node where the other end of the respective cell balancing circuit is connected to a cathode terminal of the corresponding battery cell across another diagnosis resistor.

20. The method for diagnosing an abnormality in a cell balancing circuit according to claim 19, wherein the determining of whether there is an abnormality in the cell balancing circuit comprises determining that the cell balancing circuit to be diagnosed is normal, when the voltage difference of the adjacent cell balancing circuit measured while the cell balancing circuit to be diagnosed is turned off, has a smaller voltage level than the voltage difference of the adjacent cell balancing circuit measured while the cell balancing circuit to be diagnosed is turned on.

21. The method for diagnosing an abnormality in a cell balancing circuit according to claim 19, wherein the determining of whether there is an abnormality in the cell balancing circuit comprises determining that an open circuit occurred in the cell balancing circuit to be diagnosed, when the voltage differences of the adjacent cell balancing circuit measured while the cell balancing circuit to be diagnosed is turned on and off, have the same voltage level as the corresponding cell voltage.

22. The method for diagnosing an abnormality in a cell balancing circuit according to claim 19, wherein the determining of whether there is an abnormality in the cell balancing circuit comprises determining that a short circuit occurred in the cell balancing circuit to be diagnosed, when the voltage differences of the adjacent cell balancing circuit measured while the cell balancing circuit to be diagnosed is turned on and off, have a higher voltage level than the corresponding cell voltage.

23. The method for diagnosing an abnormality in a cell balancing circuit according to claim 19, further comprising:
visually or audibly informing an abnormality in the cell balancing circuit when it is determined that the abnormality occurred in the cell balancing circuit.

24. A method for diagnosing an abnormality in the entire cell balancing circuit using a plurality of cell balancing circuits respectively connected to a plurality of battery cells included in a battery pack for balancing voltages of the battery cells, a diagnosis resistor respectively installed between each cell balancing circuit and each of a respective cathode terminal and a respective anode terminal of the corresponding battery cell, and a discharge resistor and a diagnosis switch installed between one battery cell that is at a highest potential side or a lowest potential side of the battery cells and the corresponding cell balancing circuit, the method comprising:
measuring a first voltage difference and a second voltage difference of the entire plurality of cell balancing circuits when the entire plurality of cell balancing circuits are turned on and off and the diagnosis switch is turned on and off, the abnormality includes an open circuit and a short circuit;
wherein a voltage difference of each cell balancing circuit is a difference in voltage between a low potential node where one end of the cell balancing circuit is connected to an anode terminal of the corresponding battery cell across one diagnosis resistor, and a high potential node where the other end of the cell balancing circuit is connected to a cathode terminal of the corresponding battery cell across another diagnosis resistor;
the first voltage difference is calculated from the sum of voltage differences of all the cell balancing circuits when they are all turned on or off while the diagnosis switch is turned off;
wherein the second voltage difference is calculated from the sum of voltage differences of all the cell balancing circuits when they are all turned on or off while the diagnosis switch is turned on; and
determining whether there is an abnormality in the entire plurality of cell balancing circuits, based on a variation pattern of the first voltage difference and the second voltage difference of the entire plurality of cell balancing circuits.

25. The method for diagnosing an abnormality in a cell balancing circuit according to claim 24, wherein
the determining of whether there is an abnormality in the entire plurality of cell balancing circuits comprises determining that an open circuit occurred in the entire plurality of cell balancing circuits, when the sums of voltage differences of the entire plurality of cell balancing circuits measured while the entire plurality of cell balancing circuits are turned on and the diagnosis switch is turned on and off, respectively, each has the same voltage level as the entire cell voltage.

26. The method for diagnosing an abnormality in a cell balancing circuit according to claim 24, wherein
the determining of whether there is an abnormality in the entire plurality of cell balancing circuits comprises determining that a short circuit occurred in the entire plurality of cell balancing circuits, when the sum of voltage differences of the entire plurality of cell balancing circuits measured while the entire plurality of cell balancing circuits are turned off and the diagnosis switch is turned on, has a smaller voltage level than the sum of voltage differences of the entire plurality of cell balancing circuits measured while the entire plurality of cell balancing circuits are turned off and the diagnosis switch is turned off.

27. The method for diagnosing an abnormality in a cell balancing circuit according to claim 24, further comprising:
visually or audibly informing an abnormality in the entire plurality of cell balancing circuits when it is determined that the abnormality occurred in the entire plurality of cell balancing circuits.

* * * * *